(12) United States Patent
Lee

(10) Patent No.: US 7,327,606 B2
(45) Date of Patent: Feb. 5, 2008

(54) FLASH MEMORY DEVICE AND METHOD OF PROGRAMMING THE SAME

(75) Inventor: Chang-Hyun Lee, Gyeonggi-do (KR)

(73) Assignee: Samsung ElectronicsCo., Ltd. (KR)

( * ) Notice: Subject to any disclaimer, the term of this patent is extended or adjusted under 35 U.S.C. 154(b) by 121 days.

(21) Appl. No.: 11/381,579

(22) Filed: May 4, 2006

(65) Prior Publication Data

US 2006/0250850 A1    Nov. 9, 2006

(30) Foreign Application Priority Data

May 6, 2005    (KR) .................... 10-2005-0037933

(51) Int. Cl.
 *G11C 16/04* (2006.01)
(52) U.S. Cl. .................... 365/185.17; 365/185.18
(58) Field of Classification Search ........... 365/185.17, 365/185.18, 185.23, 185.28
See application file for complete search history.

(56) References Cited

U.S. PATENT DOCUMENTS

| | | | |
|---|---|---|---|
| 5,959,892 A * | 9/1999 | Lin et al. ................ | 365/185.28 |
| 5,973,962 A * | 10/1999 | Kwon .................... | 365/185.18 |
| 2002/0126532 A1 | 9/2002 | Matsunaga et al. | |
| 2004/0080980 A1 | 4/2004 | Lee | |
| 2004/0105308 A1 | 6/2004 | Matsunaga et al. | |

FOREIGN PATENT DOCUMENTS

| | | |
|---|---|---|
| JP | 2002-260390 | 9/2002 |
| JP | 2004-185690 | 7/2004 |
| KR | 1020030009074 A | 1/2003 |
| KR | 1020040047725 A | 6/2004 |

* cited by examiner

*Primary Examiner*—Vu A. Le
(74) *Attorney, Agent, or Firm*—Myers Bigel Sibley & Sajovec PA

(57) ABSTRACT

A non-volatile memory device includes an array of flash memory cells therein and a voltage generator. The voltage generator is configured to generate a program voltage (Vpgm), a pass voltage (Vpass), a blocking voltage (Vblock) and a decoupling voltage (Vdcp) during a flash memory programming operation. The blocking voltage is generated at a level that inhibits inadvertent programming of an unselected memory cell(s). This voltage level of the blocking voltage is set so that Vdcp<Vblock≦Vpass<Vpgm. The decoupling voltage (Vdcp) has a magnitude that is greater than a maximum threshold voltage of an erased memory cell in the array and less than a minimum threshold voltage of a programmed memory cell in the array. A row selection circuit is also provided. This row selection circuit is electrically coupled to word lines in the array and to the voltage generator. The row selection circuit is configured to route the program, blocking, decoupling and pass voltages from the voltage generator to first, second, third and fourth word lines in the array, respectively, where the second word line is spaced between the first and third word lines.

15 Claims, 11 Drawing Sheets

Fig. 4

| Symbol & Signal | | Voltage Levels | |
|---|---|---|---|
| | BL | Vcc | Vcc |
| | SSL | Vcc | Vcc |
| | WL31 ⋮ | Vpass | Vpass |
| | WL$_{n+2}$ | Vpass | Vdcp |
| | WL$_{n+1}$ | Vdcp | Vblock |
| | WL$_n$ | Vpgm | Vpgm |
| | WL$_{n-1}$ | Vblock | Vblock |
| | WL$_{n-2}$ ⋮ | Vdcp | Vdcp |
| | WL0 | Vpass | Vpass |
| | GSL | 0.0V | 0.0V |
| | CSL | V$_{CSL}$ | V$_{CSL}$ |

Fig. 7

| Symbol & Signal | | Voltage Levels | |
|---|---|---|---|
| (circuit diagram) | BL | Vcc | Vcc |
| | SSL | Vcc | Vcc |
| | WL31 ⋮ | Vpass | Vpass |
| | WL$_{n+2}$ | Vpass | Vpass |
| | WL$_{n+1}$ | Vpass | Vpass |
| | WL$_n$ ⋮ | Vpass | Vpass |
| | WL2 | Vpass | Vdcp |
| | WL1 | Vdcp | Vblock |
| | WL0 | Vpgm | Vpgm |
| | GSL1 | Vblock | Vblock |
| | GSL2 | 0.0V | 0.0V |
| | CSL | V$_{CSL}$ | V$_{CSL}$ |

FLASH MEMORY DEVICE AND METHOD OF PROGRAMMING THE SAME

REFERENCE TO PRIORITY APPLICATION

This U.S. non-provisional patent application claims priority under 35 U.S.C. § 119 to Korean Patent Application 2005-37933 filed on May 6, 2005, the entire contents of which are hereby incorporated herein by reference.

FIELD OF THE INVENTION

The present invention relates to memory devices and, more particularly, to nonvolatile memory devices and methods of programming nonvolatile memory devices.

BACKGROUND OF THE INVENTION

Nonvolatile memory devices retain data even in the absence of a power supply. Flash memories, which are a type of nonvolatile memory device, are widely used in computers and memory cards because they have many preferred characteristics, including the ability to be erased efficiently. Flash memories are often distinguished into NAND and NOR types, based on how the memory cells are connected to bitlines. A NOR flash memory is configured so that a bitline is connected to two more cell transistors in parallel, storing data by way of channel hot-electron effect and erasing data by way of the Fowler-Nordheim (F-N) tunneling effect. A NAND flash memory is configured so that a bitline is connected to two more cell transistors in series, storing and erasing data by way of the F-N tunneling effect. NOR flash memories may be disadvantageous for high integration density because they dissipate much current, but are advantageous for adapting high-frequency operations. NAND flash memories may be advantageous when seeking high integration density because they consume significantly less current than NOR flash memories.

FIG. 1 is a circuit diagram showing a memory cell array 10 of a general NAND flash memory device. The flash memory device, also known as a flash EEPROM (electrically erasable and programmable read-only-memory), includes the memory cell array 10 that is composed of plurality of floating-gate cell transistors. The memory cell array 10 is constructed with multiple memory blocks in which pluralities of bitlines BL1~BLm are arranged in parallel. Each memory block includes pluralities of cell strings (or "NAND strings") which correspond each to the bitlines BL1~BLm. The circuit configuration of a plurality of cell strings belonging to a single block is shown in FIG. 1.

As shown in FIG. 1, each NAND string includes a string selection transistor SST, a ground selection transistor GST, and multiple floating-gate cell transistors M0~M31 (e.g., 32 in number) that are serially connected between the source of the string selection transistor SST and the drain of the ground selection transistor GST. The drain of the string selection transistor SST included in each string is connected to the bitline corresponding thereto, and the source of the ground selection transistor GST is connected to a common source line (or common signal line) CSL. The gates of the string selection transistors SST of the NAND strings are coupled to a string selection line SSL in common, and the gates of the ground selection transistors GST are connected to a ground selection line GSL. The control gates of the floating-gate cell transistors M0~M31 included in each NAND string are coupled respectively to wordlines WL0~WL31. The bitlines BL1~BLm are electrically connected to a page buffer circuit (not shown) of the flash memory device.

The ground selection line GSL, the wordlines WL0~WL31, and the string selection line SSL are connected each to signal selection lines, GS, Si0~Si31, and SS, through block selection transistors BS0~BS33, respectively. The block selection transistors BS0~BS33, which are included in a row decoder circuit (not shown) of the flash memory device, are controlled by a block-selection control signal BS. The signal selection lines, GS, Si0~Si31, and SS, are driven by selection circuits (or drive circuits) during each programming operation. The block-selection control signal BS is configured to have a high voltage level, when active, so as to make a program or pass voltage sufficiently transferred to the wordlines WL0~WL31 via the signal selection lines Si0~Si31.

The floating-gate cell transistors, within memory cells M0~M31, are first erased to have a predetermined threshold voltage (e.g., −3V). Then, during programming, a high voltage (e.g., 20V) is applied to a wordline of a selected memory cell to thereby conduct a practical programming operation for the selected memory cell. In order to accomplish a successful programming result for the selected memory cell, a threshold voltage of the selected memory cell must be increased while the rest of the deselected memory cells are maintained without change. However, as shown in FIG. 1, since the control gates of the floating-gate cell transistors M0~M31 included in the cell strings are connected to the wordlines WL0~WL31 in common along rows, some problems may occur during the programming operation as follows. When a program voltage is supplied to a selected wordline, the program voltage is applied also to deselected memory cells arranged along the same wordline as well as the selected memory cell. As a result, the deselected memory cell, which is arranged along the same wordline, may become programmed. Thus, accidental programming may result for a deselected memory cell connected to a selected wordline. This accidental programming is caused by a phenomenon known as "program disturbance."

Several ways of preventing the effect of program disturbance have been proposed. For example, program inhibition by a self-boosting scheme is disclosed in U.S. Pat. No. 5,677,873, entitled METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN, and in U.S. Pat. No. 5,991,202 entitled METHOD OF REDUCING PROGRAM DISTURB DURING SELF-BOOSTING IN A NAND FLASH MEMORY. Program inhibition by a local self-boosting scheme is disclosed in U.S. Pat. No. 5,715,194, entitled BIAS SCHEME OF PROGRAM INHIBIT FOR RANDOM PROGRAMMING IN A NAND FLASH MEMORY, and in U.S. Pat. No. 6,061,270, entitled A METHOD FOR PROGRAMMING A NON-VOLATILE MEMORY DEVICE WITH PROGRAM DISTURB CONTROL. The program-inhibiting method by the local self-boosting scheme raises a channel boosting voltage of a program-inhibited cell transistor higher than the method by the self-boosting scheme. Thus, the local self-boosting scheme is widely used in programming multi-level memory cells in a flash memory device.

However, even with the aforementioned program-inhibiting methods, the problem of program disturbance may still be present as the integration density of the flash memory device gradually increases. This is because an increase in the integration density of the flash memory device narrows intervals between adjacent memory cells and between adjacent signal lines and this narrowing increases the probability of coupling interference. In particular, since the program voltage applied to a selected wordline is set at a very high level relative to a power source voltage of the flash memory device, the probability of a high voltage influencing the voltages on wordlines adjacent to a selected wordline increases.

FIG. 2 is a schematic diagram illustrating a soft-programming effect that is generated in a program-inhibited memory cell as the flash memory device is increased in integration density. In FIG. 2, there is shown the configuration of potentials formed in channels of the program-inhibited cell 120 and memory cells 110 and 130 adjacent thereto while employing a programming method that includes a local self-boosting scheme.

Referring to FIGS. 1 and 2, in the programming method with the local self-boosting scheme, a bitline voltage of 0V is first applied to a selected bitline (i.e., a bitline connected to floating-gate cell transistors to be programmed), while a power source voltage Vcc is applied to a deselected bitline (i.e., a bitline connected to floating-gate cell transistors to be program-inhibited).

And then, a decoupling voltage of 0V is applied to two deselected wordlines, $WL_{n-1}$ and $WL_{n+1}$, immediately adjacent to a selected wordline WLn, while a pass voltage Vpass of 10V is applied to other deselected wordlines. During this step, a drain voltage of the floating-gate cell transistor 130, which is coupled to the upper wordline $WL_{n+1}$, and a source voltage of the floating-gate cell transistor 110, which is coupled to the lower wordline $WL_{n-1}$, is raised through a boosting operation by the pass voltage Vpass. As a result, the memory cells, 110 and 130, to which the decoupling voltage is applied, are shut off to thereby electrically isolate channels of the rest of the cells from the channel of the memory cell 120, to which the program voltage Vpgm is applied. This cuts off the current flowing into the memory cells 110 and 130 that are located adjacent to the source and drain of the program-inhibited cell 120.

In this case, the potentials formed in the channels of the memory cells, 110 and 130, which are immediately adjacent to the source and drain of the program-inhibited cell 120, are noticed by P1 and P4 shown in FIG. 2, respectively. As illustrated in FIG. 2, the potential P1, which is formed in the channel of the lower memory cell 110 of the program-inhibited cell 120, is larger than the potential P4, which is formed in the channel of the higher memory cell 130 of the program-inhibited cell 120. This is because the threshold voltage of the lower memory cell 110 has been already raised up to 1V before the program voltage Vpgm is applied to the selected wordline WLn. As well known, the programming operation begins first to the memory cell nearest to the ground selection line GSL, proceeding toward the string selection line SSL in sequence. Accordingly, while the memory cell 130 coupled to the upper wordline $WL_{n+1}$ of the wordline WLn is held on an erased state with the threshold voltage of −3V (i.e., a low potential state) when a memory cell coupled to the wordline WLn is being programmed, the memory cell 110 coupled to the lower wordline $WL_{n-1}$ of the wordline WLn may be conditioned in a programmed state with the threshold voltage of 1V (i.e., a high potential state).

Continuously, when the program voltage Vpgm is applied to the selected wordline WLn, a channel voltage of the program-inhibited cell 120 is boosted up to the level of the program voltage Vpgm. The boosted channel voltage Vbst of the program-inhibited cell 120 is summarized as follows.

$$Vbst=(Vcc-Vth\_SSL)/n+Vpgm*Cin/(Cin+Cch) \quad \text{[Equation 1]}$$

Here, the parameter Vth_SSL represents a threshold voltage Vth of the string selection transistor and the parameter Cch represents channel capacitance. The parameter Cin is defined as Cin=Cono*Ctunn/(Cono+Ctunn) and the parameter n means the number of the floating-gate cell transistors belonging to a string (e.g., 32). The parameter Cono denotes capacitance of an oxide-nitride-oxide (ONO) film interposed between floating and control gates in the program-inhibited cell 120, and the parameter Ctunn denotes capacitance of a tunnel oxide film interposed between the floating gate and the semiconductor substrate in the program-inhibited cell 120.

According to an increase of the channel voltage of the program-inhibited cell 120 to which the program voltage Vpgm is applied, as shown by the Equation 1, it decreases the potential between the floating gate and channel in the program-inhibited cell 120 (refer to P3 of FIG. 2). As a result, there is no generation of the F-N tunneling effect between the floating gate and channel in the program-inhibited cell 120, preventing the memory cell 120 from being programmed.

Meanwhile, as the program voltage Vpgm is very high as much as reaching 20V, it boosts up channel voltages of the memory cells 110 and 130 those are adjacent to the program-inhibited cell 120, as well as the program-inhibited cell 120. Here, a voltage range $\Delta V_{B1}$ available to be increased in the channel of a memory cell adjacent to the program-inhibited cell 120 (i.e., the memory cell 110 located at the lower side of the program-inhibited cell 120), is relatively lower than a voltage range $\Delta V_{B3}$ available to be increased in the channel of the program-inhibited cell 120. Thus, there is generated a potential difference $\Delta P$, higher than a level, in an N-well region (i.e., a common source-drain region of the memory cells 110 and 120 adjacent to each other) through which the program-inhibited cell 120 links with the memory cell 110 located lower than the cell 120. Thereby, electrons are accelerated to move toward the floating gate of the program-inhibited cell 120 (see the arrow ① in FIG. 2). On the other hand, as the program voltage Vpgm is charged on the floating gate of the program-inhibited cell 120, there is generated a vertical electric field between the floating gate and channel of the program-inhibited cell 120 (see the arrow ②). Due to this electric field, a problem occurs because the accelerated electrons (i.e., hot carriers) are injected into the floating gate of the program-inhibited cell 120. As such, an effect of increasing the threshold voltage of the program-inhibited cell 120 by hot carriers is called "soft-programming", which increases the threshold voltage of the program-inhibited cell 120 and thereby causes the program-inhibited cell 120 to be inadvertently programmed. Therefore, as the integration density of the flash memory device is increased, it is necessary to prevent the problem of program disturbance such as the soft-programming effect.

SUMMARY OF THE INVENTION

Embodiments of the present include a non-volatile memory device having an array of flash memory cells therein and a voltage generator. The voltage generator is configured to generate a program voltage (Vpgm), a pass voltage (Vpass), a blocking voltage (Vblock) and a decoupling voltage (Vdcp) during a flash memory programming operation. In particular, the blocking voltage is generated at a level that inhibits inadvertent programming of an unselected memory cell(s). This voltage level of the blocking voltage is set so that Vdcp<Vblock≦Vpass<Vpgm. The decoupling voltage (Vdcp) has a magnitude that is greater than a maximum threshold voltage of an erased memory cell in the array and less than a minimum threshold voltage of a programmed memory cell in the array. A row selection circuit is also provided. This row selection circuit is electrically coupled to word lines in the array and to the voltage generator. The row selection circuit is configured to route the program, blocking, decoupling and pass voltages from the voltage generator to first, second, third and fourth word lines in the array, respectively, where the second word line is spaced between the first and third word lines. According to some of these embodiments, the first and second word lines are immediately adjacent word lines and the second and third word lines are immediately adjacent word lines. The third and fourth word lines may also be immediately adjacent word lines.

According to additional embodiments of the invention, the row selection circuit is configured to route the blocking and decoupling voltages from the voltage generator to fifth and sixth immediately adjacent word lines in the array, respectively, with the fifth and first word lines being immediately adjacent word lines. Furthermore, the array of flash memory cells may include a plurality of NAND-type strings of memory cells having respective ground selection transistors therein. In this case, a word line electrically coupled to a plurality of the ground selection transistors may receive the blocking voltage during the flash memory programming operation.

Still further embodiments of the invention include methods of programming a flash memory array. The methods include driving a selected wordline in the flash memory array with a program voltage (Vpgm) during a programming operation while simultaneously driving a first unselected wordline extending immediately adjacent the selected wordline with a blocking voltage (Vblock) and a second unselected wordline extending immediately adjacent the first unselected wordline with a decoupling voltage (Vdcp) and a third unselected wordline extending immediately adjacent the second unselected wordline with a pass voltage (Vpass), where Vdcp<Vblock≦Vpass<Vpgm. The decoupling voltage (Vdcp) has a magnitude that is greater than a maximum threshold voltage of an erased memory cell in the flash memory array and less than a minimum threshold voltage of a programmed memory cell in the flash memory array.

BRIEF DESCRIPTION OF THE FIGURES

Non-limiting and non-exhaustive embodiments of the present invention will now be described with reference to the following figures, wherein like reference numerals refer to like parts throughout the various figures unless otherwise specified. In the figures:

FIG. 4 is a diagram summarizing a scheme of applying voltages for programming the flash memory device in accordance with a preferred embodiment of the invention;

FIGS. 6 and 7 are diagrams summarizing schemes of applying voltages to the flash memory device in accordance with another embodiment of the invention;

DETAILED DESCRIPTION OF PREFERRED EMBODIMENTS

Preferred embodiments of the invention will be described below in more detail with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art.

Figure 3:
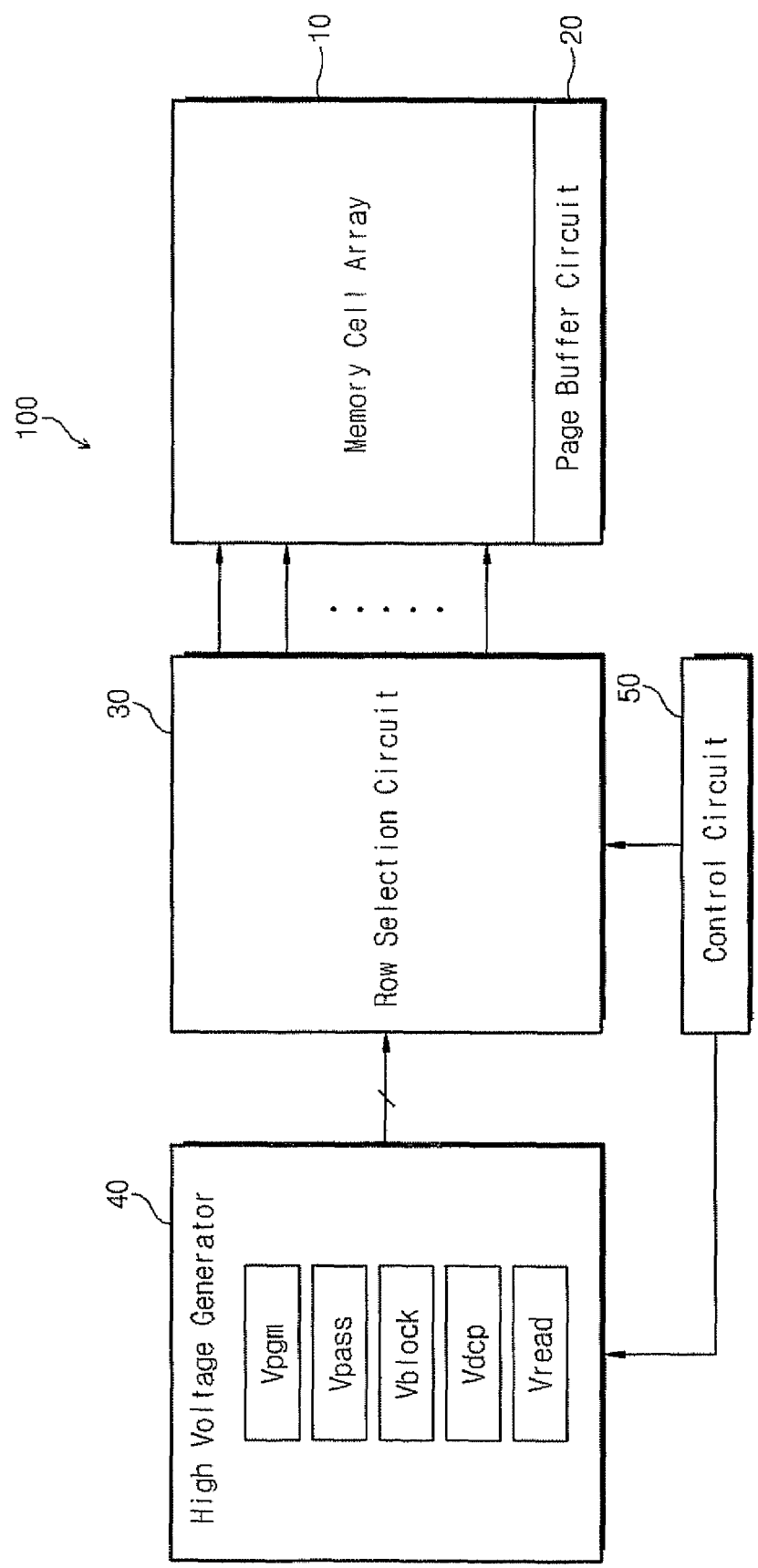
FIG. 3 is a block diagram of a flash memory device in accordance with a preferred embodiment of the invention.

FIG. 3 is a block diagram of a flash memory device 100 in accordance with a preferred embodiment of the invention. Referring to FIG. 3, the flash memory device 100 includes a memory cell array 10, a page buffer circuit 20, a row selection circuit 30, a high voltage generator 40, and a control circuit 50. The control circuit 50 regulates an operation of generating a high voltage by the high voltage generator 40 and an operation of applying the high voltage by the row selection circuit 30. The control circuit 50 enables the row selection circuit 30 to apply a blocking voltage Vblock to at least one or more wordlines most immediately adjacent to a selected wordline and to apply a decoupling voltage Vdcp to a wordline immediately adjacent to the wordline to which the blocking voltage Vblock is applied. As a result, even with a higher integration density of the flash memory device, program disturbances, such as a soft-programming effect, can be prevented. In other words, the elimination of a potential difference between a channel of a program-inhibited cell and a channel of a memory cell adjacent to the program-inhibited cell interrupts the establishment of a potential difference between the channels that is responsible for the soft-programming effect. Hereinafter, it will be described in detail about the functions and organizations of the blocks included in the flash memory device 100.

Figure 1:
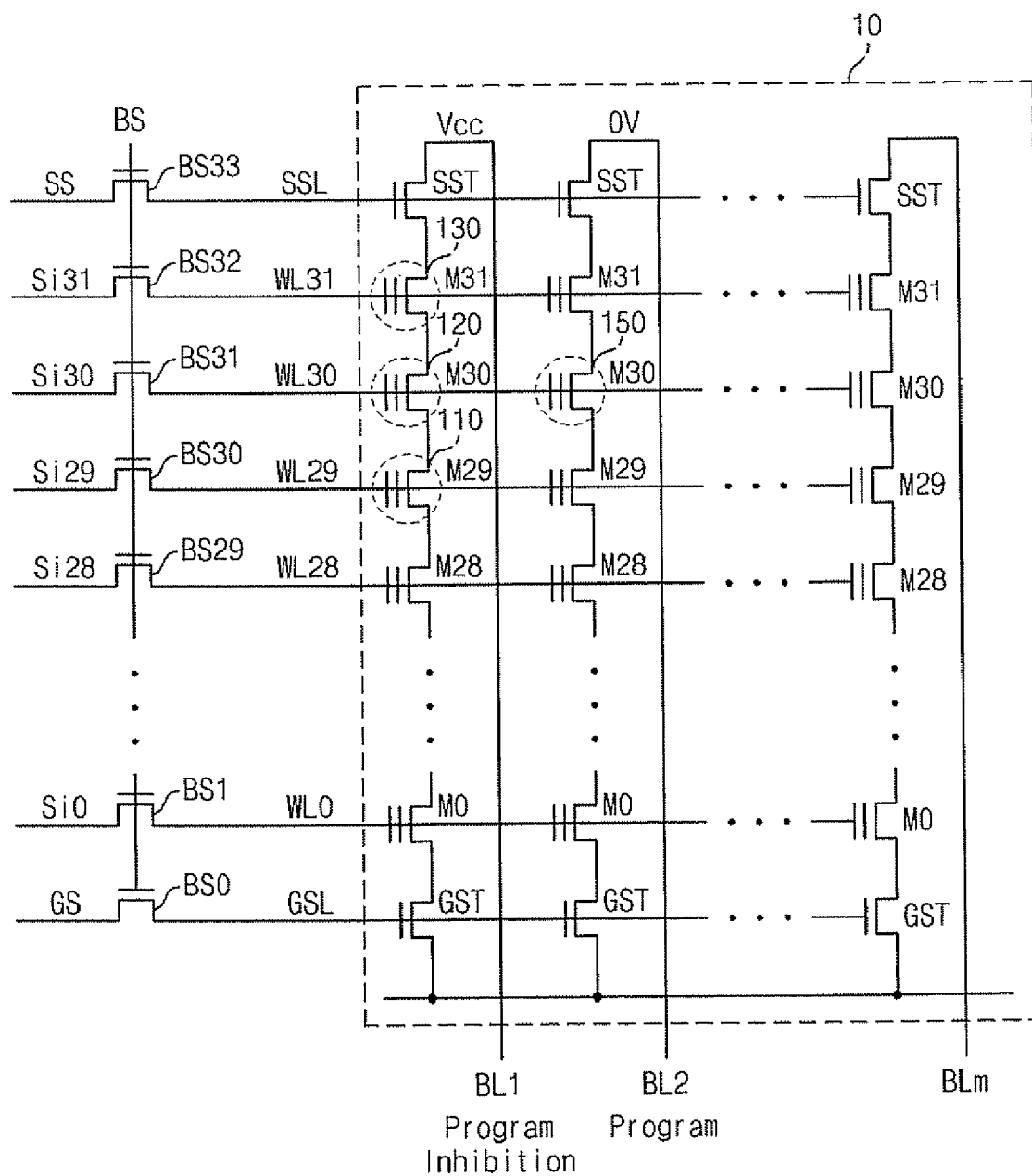
FIG. 1 is a circuit diagram showing a memory cell array of a general NAND flash memory device.
Figure 6:
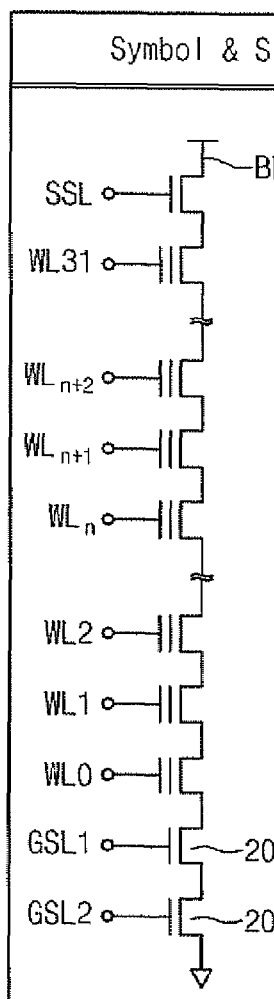
Figure 9:
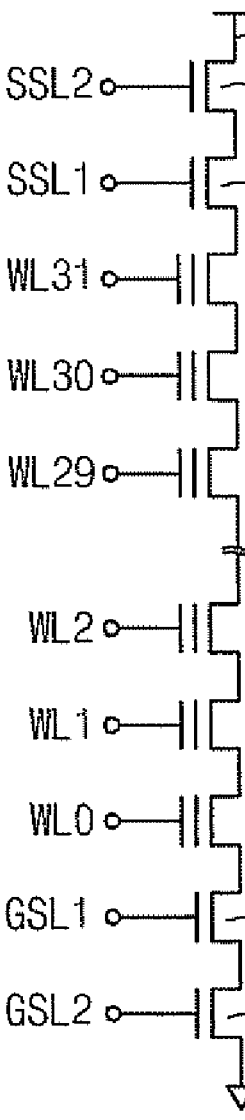
FIG. 9 is a diagram summarizing a scheme of applying voltages to the flash memory device in accordance with another embodiment of the invention.

The memory cell array 10 includes a plurality of bitlines and wordlines and a plurality of memory cells disposed at regions intersecting the bitlines and wordlines. The memory cell array 10 shown in FIG. 3 is primarily constructed in the same NAND-string structure with that shown in FIG. 1. The NAND-string structure includes a string selection transistor SST and a ground selection transistor GST. However, according to additional embodiments of the invention or patterns of applying voltages to be used in a programming operation, the NAND string may include two ground selection transistors 210 and 203, or two string selection transistors 211 and 213, in a single NAND cell string, as shown in FIGS. 6, 7, and 9.

The page buffer circuit 20 functions to store data in the memory cell array 10 and reads out data from the memory cell array 10. The page buffer circuit 20 is connected to the memory cell array 10 via the bitlines. The page buffer circuit includes a plurality of page buffers (not shown) coupled to the bitlines. Each page buffer stores a data bit to be programmed into a memory cell or to be read out from a memory cell. In a programming operation, a bitline is supplied with a ground voltage 0V or a power source voltage Vcc in accordance with a data value stored in each page buffer. For instance, the ground voltage 0V is applied to a bitline connected to a page buffer that is storing 0 as a data value (i.e., a bitline connected to a memory cell to be programmed). Otherwise, the power source voltage Vcc is applied to a bitline connected to a page buffer that is storing 1 as a data value (i.e., a bitline connected to the program-inhibited cell).

As well known, the flash memory device performs a programming operation after an erasing operation is performed on a block of memory cells. An erased memory cell stores 1 as a data bit. Thus, the fact that a data bit stored in a page buffer is 1 means that its correspondent memory cell is one not to be programmed. And, the fact that a data bit stored in a page buffer is 0 means that its correspondent memory cell is one to be programmed.

The high voltage generator 40 supplies the various high voltages necessary for writing and reading data in the flash memory device 100 (e.g., a program voltage Vpgm, a pass voltage Vpass, the blocking voltage Vblock, the decoupling voltage Vdcp, and a read voltage Vread). The program voltage Vpgm is applied to a selected wordline during a programming operation, being set on about 20V. The pass voltage Vpass is applied to deselected wordlines. The rest of the wordlines are supplied with the blocking voltage Vblock and the decoupling voltage Vdcp, being lower than the program voltage Vpgm but higher than the blocking voltage Vblock.

Figure 10:
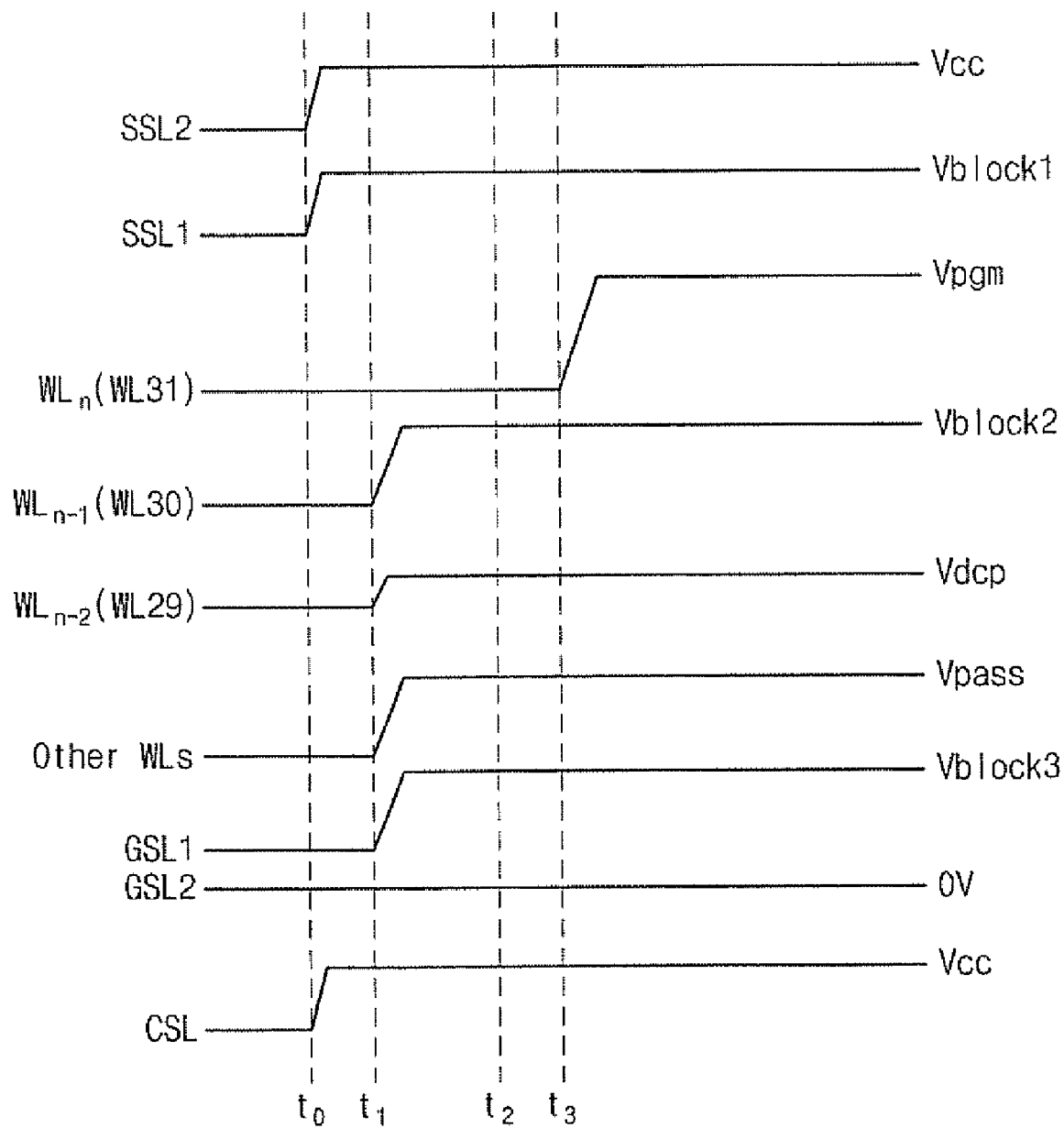
FIG. 10 is a timing diagram illustrating points at which the voltages shown in FIG. 9 are applied.

The blocking voltage Vblock is provided to prevent a potential difference from being generated between the channel of the program-inhibited cell and the channel of a memory cell adjacent to the program-inhibited cell, during the programming operation. The blocking voltage Vblock is applied to at least one or more wordlines most adjacent to the selected wordline, and is equal to or less than the pass voltage Vpass and higher than the maximum threshold voltage of the memory cell to be programmed. The blocking voltage Vblock may be used even with the pass voltage Vpass, the power source voltage Vcc, or the read voltage Vread. Moreover, although the pass voltage Vpass, the power source voltage Vcc, and the read voltage Vread, are set at fixed voltage levels, the blocking voltage Vblock may be set at various voltage levels that are suitable for its operable range. In addition, a plurality of the blocking voltage Vblock may be identical to each other or different from each other, for example, Vblock1-Vblock3 as shown in FIGS. 9 and 10.

The decoupling voltage Vdcp is provided to cut off a current flow between memory cells adjacent to the program-inhibited memory cell and other memory cells. The decoupling voltage Vdcp is applied to at least one or more wordlines adjacent to a wordline to which the blocking voltage Vblock is applied, or applied to an upper wordline most adjacent to a selected wordline during a programming operation. The decoupling voltage Vdcp is lower than the minimum threshold voltage of a programmed memory cell and higher than the maximum threshold voltage of an erased memory cell. The decoupling voltage Vdcp may be used with a ground voltage of 0V or less. The decoupling voltage Vdcp may be set at various voltage levels that are suitable for its operable range.

The row selection circuit 30 functions to decode a row address for a memory cell to be programmed, to select a wordline corresponding to the decoded address, and to apply correspondent voltages to the selected wordline and the other wordlines adjacent to the selected wordline. These functions of the row selection circuit 30 are carried out under regulation by the control circuit 50. According to the present invention, the row selection circuit 30 applies the blocking voltage Vblock and the decoupling voltage Vdcp to lower wordlines sequentially adjacent to the selected wordline (i.e., wordlines between selected wordline and ground selection line), while it applies the pass voltage Vpass to deselected wordlines the rest thereof, during the programming operation. And then, the program voltage Vpgm is applied to the selected wordline.

Figure 5:
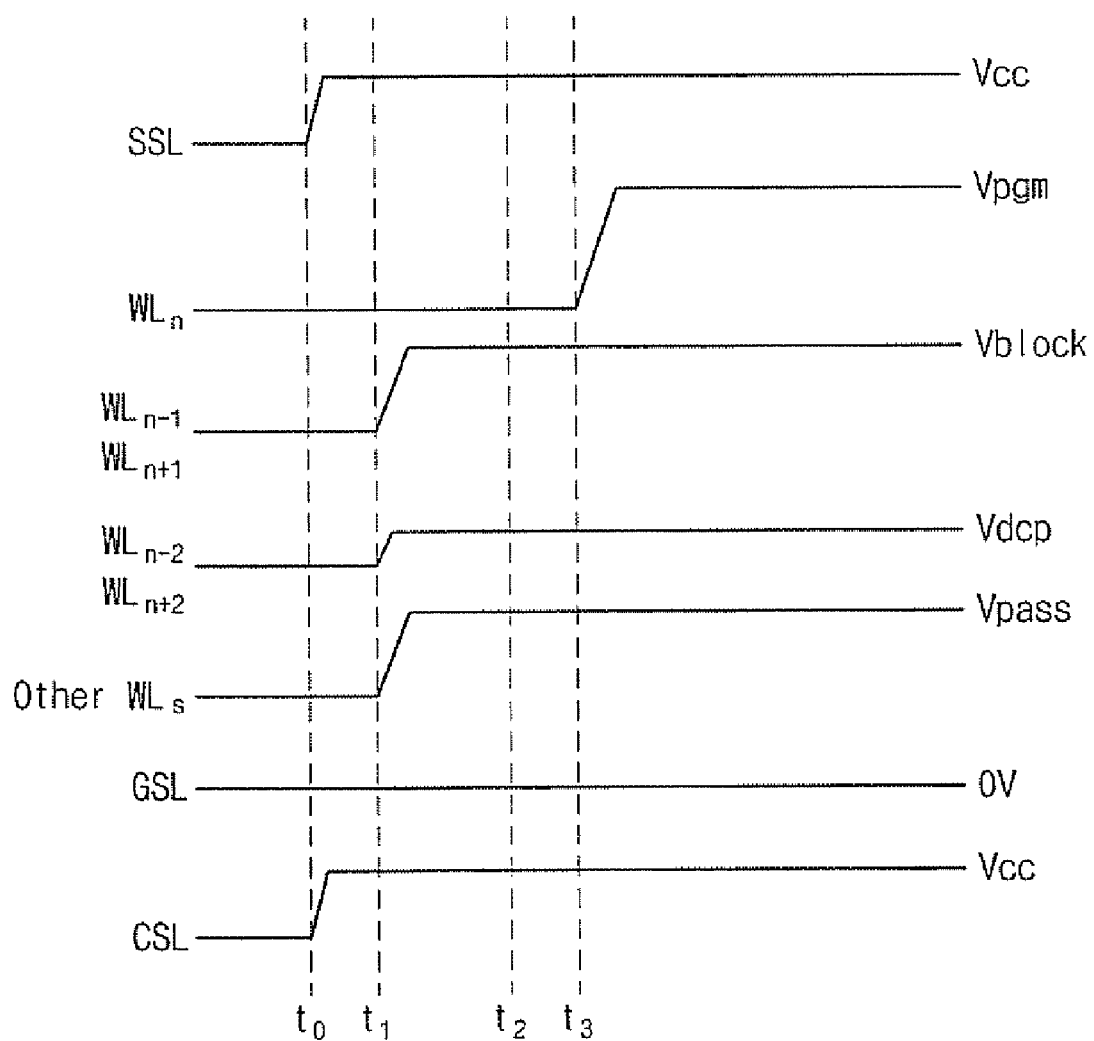
FIG. 5 is a timing diagram illustrating points at which the voltages shown in FIG. 4 are applied.

FIG. 4 is a diagram summarizing a scheme of applying voltages for programming a flash memory device in accordance with a preferred embodiment of the invention, and FIG. 5 is a timing diagram illustrating points at which the voltages shown in FIG. 4 are applied. In FIGS. 4 and 5, there is shown a voltage biasing pattern for preventing the program-inhibited memory cell from being programmed inadvertently in the case that the NAND string includes a single ground selection transistor GST and a single string selection transistor SST.

Referring to FIGS. 4 and 5, at a point $t_0$, the ground voltage 0V is applied to a bitline (i.e., a selected bitline) connected to a memory cell to be programmed and the power source voltage Vcc is applied to a bitline (i.e., a deselected bitline) connected to the program-inhibited memory cell. Further, at the point $t_0$, the power source voltage Vcc is applied to the string selection line SSL and the common source line CSL while the ground voltage 0V is applied to the ground selection line GSL. As a result, the string selection transistor SST to be associated with the program-inhibited cell is charged up to Vcc−Vth (Vth is a threshold voltage of the string selection transistor) and then shut off to make its source floated.

Continuously, at a point $t_1$, the blocking voltage Vblock, the decoupling voltage Vdcp, and the pass voltage Vpass are applied to corresponding wordlines. In detail, the blocking voltage Vblock is applied to at least one or more wordlines, $WL_{n-1}$, or $WL_{n-1}$ and $WL_{n+1}$, most adjacent to the selected wordline WLn, Here, $WL_{n-1}$ corresponds to the lower wordline most adjacent to the selected wordline WLn (hereinafter, referred to as "first lower-adjacent wordline"). And, $W_{n+1}$ corresponds to the upper wordline most adjacent to the selected wordline WLn (hereinafter, referred to as "first upper-adjacent wordline"). In need of supplying the blocking voltage Vblock to an alternative one of the two wordlines $WL_{n-1}$ and $WL_{n+1}$ that are most adjacent to the selected wordline WLn, it is preferred to apply the blocking voltage Vblock to the first lower-adjacent wordline $WL_{n-1}$. The reason why the blocking voltage Vblock should be applied to the first lower-adjacent wordline $WL_{n-1}$ is because the program disturbance such as the soft-programming effect is frequently generated between a channel of the program-inhibited cell and a channel of a memory cell connected to the first lower-adjacent wordline $WL_{n-1}$.

Hereinafter will be described about the modes of supplying the blocking voltage Vblock to an alternative one (i.e., the first lower-adjacent wordline $WL_{n-1}$) of the two wordlines $WL_{n-1}$ and $WL_{n+1}$ that are most adjacent to the selected wordline WLn, and of supplying the blocking voltage Vblock to both of the two adjacent wordlines $WL_{n-1}$ and $WL_{n+1}$. First, in the mode of supplying the blocking voltage Vblock only to the first lower-adjacent wordline $WL_{n-1}$, the decoupling voltage Vdcp is applied to a lower wordline (hereinafter, referred to as "second lower-adjacent wordline"; $WL_{n-2}$) adjacent to the first lower-adjacent wordline $WL_{n-1}$ and to the first upper-adjacent wordline $WL_{n+1}$. And, the pass voltage Vpass is applied to the rest of the wordlines. Thereby, a drain voltage of the floating-gate cell transistor connected to the first upper-adjacent wordline $WL_{n+1}$ and a source voltage of the floating-gate cell transistor connected to the second lower-adjacent wordline $WL_{n-2}$ are boosted up to increase therefrom by the pass voltage Vpass applied to the deselected wordlines arranged therearound. Thus, memory cells with supply of the decoupling voltage Vdcp (i.e., the memory cells coupled to the first upper-adjacent wordline $WL_{n+1}$ and the second lower-adjacent wordline $WL_{n-2}$) are shut off to electrically isolate a channel of the memory cell, to which the program voltage Vpgm is applied, from channels of the other memory cells. As a result, current is interrupted from flowing toward the memory cells coupled to the first upper-adjacent wordline $WL_{n+1}$ and the second lower-adjacent wordline $WL_{n-2}$.

After then, when the program voltage Vpgm is applied to the selected wordline WLn at a point $t_3$, channels of the memory cells coupled to the selected wordline WLn and the first lower-adjacent wordline $WL_{n-1}$ become conductive. Therefore, there is no potential difference between the channels of the memory cells, preventing formation of an electric filed that accelerates electrons therein. As a result, as the motion of electrons is absent between the memory cells, the soft-programming effect is prevented for the program-inhibited memory cell because the memory cell coupled to the first lower-adjacent wordline $WL_{n-1}$ is turned on by the blocking voltage Vblock applied to the first lower-adjacent wordline $WL_{n-1}$ even though the memory cell coupled to the first lower-adjacent wordline $WL_{n-1}$ is programmed to have its threshold voltage increased. In the invention, the blocking voltage Vblock is designed to be higher than the maximum threshold voltage of a programmed memory cell but equal to or less than the pass voltage Vpass. In this case, the function of interrupting the current flow between the memory cells, which are adjacent to the program-inhibited memory cell, and other memory cells is accomplished by the memory cells coupled to the second lower-adjacent wordline $WL_{n-2}$ and the first upper-adjacent wordline $WL_{n+1}$, which are supplied with the decoupling voltage Vdcp. The channel capacitance to be boosted up by the supply of the program voltage Vpgm exists in the channel of the memory cell to which the program voltage Vpgm is applied, and in the channel of the memory cell coupled to the first lower-adjacent wordline $WL_{n-1}$. As a result, the channel voltage of the program-inhibited memory cell is effectively increased to prohibit it from being programmed. Meanwhile, as the program voltage Vpgm is so high, it gradually goes to the high level of 20V at the point $t_3$. And, the high voltage applied at the point t3 may be generated with stepping up to its target level in order to farther restrain decoupling effects between adjacent memory cells.

Next, in the mode of supplying the blocking voltage Vblock to both the first lower-adjacent wordline $WL_{n-1}$ and the first upper-adjacent wordline $WL_{n+1}$, the decoupling voltage Vdcp is applied to the second lower-adjacent wordline $WL_{n-2}$ and an upper wordline (hereinafter, referred to as "second upper-adjacent wordline"; $WL_{n+2}$) adjacent to the first upper-adjacent wordline $WL_{n+1}$. And, the pass voltage Vpass is applied to the rest of the wordlines. Thereby, a drain voltage of the floating-gate cell transistor connected to the second upper-adjacent wordline $WL_{n+2}$ and a source voltage of the floating-gate cell transistor connected to the second lower-adjacent wordline $WL_{n-2}$ are boosted up to increase therefrom by the pass voltage Vpass applied to the deselected wordlines arranged therearound. Thus, memory cells with supply of the decoupling voltage Vdcp are shut off to electrically isolate a channel of the memory cell, to which the program voltage Vpgm is applied, from channels of other memory cells. As a result, it interrupts currents flowing toward the memory cells coupled to the second upper-adjacent wordline $WL_{n+2}$ and the second lower-adjacent wordline $WL_{n-2}$.

After then, when the program voltage Vpgm is applied to the selected wordline WLn at a point $t_3$, the channels of the memory cells coupled to the selected wordline WLn and the first lower-adjacent wordline $WL_{n-1}$, and channels of the memory cells coupled to the selected wordline WLn and the first upper-adjacent wordline $WL_{n+1}$ become conductive to make a potential difference between the channels of the program-inhibited memory cell and the adjacent memory cell. As a result, as the motion of electrons is absent between the memory cells, it prevents the soft-programming effect therefrom. In this case, the function of interrupting the current flow between the memory cells, which are adjacent to the program-inhibited memory cell, and other memory cells is accomplished by the memory cells coupled to the second lower-adjacent wordline $WL_{n-2}$ and the second upper-adjacent wordline $WL_{n+2}$ those are supplied with the decoupling voltage Vdcp. The boosted channel voltage Vbst is given as follows.

$$Vbst=(Vcc-Vth\_SSL)/n+Vpgm*Cin/(Cin+3*Cch)+2*Vblock*Cin/(Cin+3*Cch) \quad \text{[Equation 2]}$$

Here, the parameter Vth_SSL represents a threshold voltage Vth of the string selection transistor and the parameter Cch represents channel capacitance. The parameter Cin is defined as $Cin=Cono*Ctunn/(Cono+Ctunn)$ and the parameter n means the number of the floating-gate cell transistors belonging to a string (e.g., 32). The parameter Cono denotes capacitance of an oxide-nitride-oxide (ONO) film interposed between floating and control gates in the program-inhibited cell 120, and the parameter Ctunn denotes capacitance of a tunnel oxide film interposed between the floating gate and the semiconductor substrate in the program-inhibited cell 120.

As can be seen from the Equation 2, according to the voltage-applying scheme, the channel voltage of the program-inhibited memory cell is boosted up to a high voltage enough to prevent the inadvertent program. Thus, the boosted channel voltage Vbst inhibits programming of program-inhibited cell.

Figure 8:
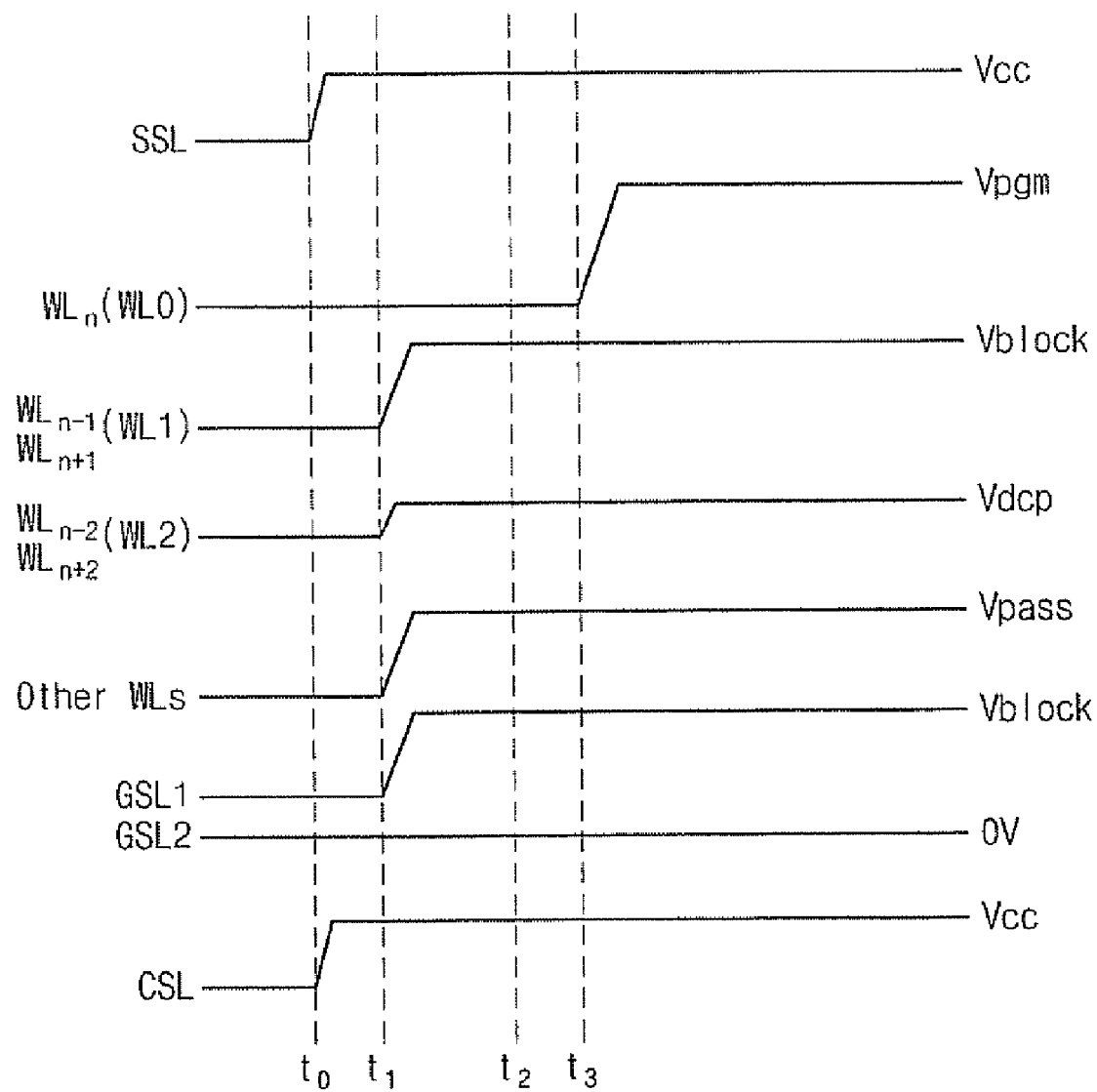
FIG. 8 is a timing diagram illustrating points at which the voltages shown in FIGS. 7 and 8 are applied.

FIGS. 6 and 7 are diagrams summarizing schemes of applying voltages to the flash memory device in accordance with another embodiment of the invention, and FIG. 8 is a timing diagram illustrating points at which the voltages shown in FIGS. 7 and 8 are applied. In FIGS. 6 through 8, there is shown a voltage-biasing pattern in the case that the NAND string is comprised of two ground selection transistors 201 and 203. The voltage biasing pattern shown in FIGS. 6 through 8 is similar to that shown in FIGS. 4 and 5, but includes the feature of applying voltages to the first and second ground selection lines GSL1 and GSL2 connected each to the two ground selection transistors 201 and 203.

Referring to FIGS. 6 through 8, in a mode of applying the program voltage Vpgm to the n'th wordline WLn, the blocking voltage Vblock is applied to the first ground selection line GSL1 adjacent downward to the lowest wordline WL0 at a point $t_1$. During this, the blocking voltage Vblock applied to the first ground selection line GSL1 is higher than a voltage (e.g., Vcc) applied to a program-inhibited bitline. And, the second ground selection line GSL2 adjacent downward to the first ground selection line GSL1 is supplied with a voltage lower than the voltage applied to the first ground selection line GSL1 (e.g., the ground voltage 0V or the decoupling voltage Vdcp). And, the blocking voltage Vblock is applied to at least one or more wordlines, $WL_{n-1}$, or $WL_{n-1}$ and $WL_{n+1}$, adjacent to the selected wordline WLn. The decoupling voltage Vdcp is applied to at least one or more wordlines, $WL_{n-2}$, or $WL_{n-2}$ and $WL_{n+2}$, adjacent to the wordlines being supplied with the blocking voltage Vblock, or to the wordline $WL_{n+1}$ most adjacent upward to the selected wordline during the programming operation. Further at the point $t_1$, the pass voltage Vpass is applied to the remaining deselected wordlines. And then, the program voltage Vpgm is applied to the selected wordline WLn at a point $t_3$. As explained previously, the blocking voltage Vblock is applied to at least one or more wordlines, $WL_{n-1}$, or $WL_{n-1}$ and $WL_{n+1}$, adjacent to the selected wordline WLn, and to the first ground selection line GSL1. During this, the blocking voltage Vblock may be used in a unique level or in different levels. In other words, the blocking level Vblock may be variable in the range that is higher than the maximum threshold voltage of a programmed memory cell, but is equal to or less than the pass voltage.

Also referring to FIGS. 7 and 8, in a mode of applying the program voltage Vpgm to the 0'th wordline WL0 (i.e., the lowest wordline), the blocking voltage Vblock is applied to the first ground selection line GSL1 adjacent downward to the lowest wordline WL0, or to the first ground selection line GSL1 and the 1'th wordline WL1. During this, the second ground selection line GSL2 adjacent downward to the first ground selection line GSL1 is supplied with the ground voltage 0V or the decoupling voltage Vdcp. While the blocking voltage Vblock is applied to the 1'th wordline WL1, the decoupling voltage Vdcp is applied to the 2'th wordline WL2. When blocking voltage Vblock is not applied to the 1'th wordline WL1, the decoupling voltage Vdcp is supplied to the 1'th wordline WL1. And, the pass voltage Vpass is applied to the rest of wordlines deselected at the point $t_1$. And then, the program voltage Vpgm is applied to the 0'th wordline WL0 at the point $t_3$. In this case, the blocking voltage Vblock is applied to the first ground selection line GSL1, or to the first ground selection line GSL1 and the 1'th wordline WL1. During this, the blocking voltage Vblock may be set at a unique level or at different levels. In other words, the blocking level Vblock may be variable in the range that is higher than the maximum threshold voltage of a programmed memory cell, or equal to or less than the pass voltage.

As stated above, with the structure that the NAND string has the two ground selection transistors 201 and 203, the blocking voltage Vblock is always applied to the first ground selection transistor GSL1 while the ground voltage 0V is always applied to the second ground selection line GSL2, regardless of whether the program voltage Vpgm is supplied to the n'th wordline WLn or the 0'th wordline WL0.

Usually, the ground voltage 0V is applied to the ground selection line GSL for program inhibition. Therefore, when the program voltage Vpgm is applied to the wordline most adjacent to the ground selection line GSL (i.e., the 0'th wordline WL0), it would cause a program-inhibited memory cell to be softly programmed because there is generated a high electric field between the channel of the program-inhibited memory cell coupled to the 0'th wordline WL0 and the channel of the ground selection transistor GST coupled to the ground selection line GSL. In order to overcome the soft-programming effect, there are two ground selection transistors 201 and 203 at least in the NAND string. Further, the blocking voltage Vblock is applied to the first ground selection transistor 201 adjacent downward to the lowest wordline WL0 of the NAND string, preventing a potential difference from being generated between the channel of the first ground selection transistor 201 and the channel of the program-inhibited memory cell. And, the ground voltage 0V or the decoupling voltage Vdcp is applied to the second ground selection transistor 203 that is adjacent downward to the first ground selection transistor 201, so that the second ground selection transistor 203 is turned off to prevent charges from leaking into the common source line CSL while boosting up the channel of the program-inhibited memory cell.

Here, the first and second ground selection transistors, 201 and 203, may be formed of floating-gate transistors the same as the memory cells, or single transistors without charge storing layers. The charge-storing layer may be formed of a conductive floating gate that is made of one among a silicon nitride film, an insulation film with high dielectric constant, silicon dots, metal dots, and silicon-germanium (Si—Ge) dots.

FIG. 9 is a diagram summarizing a scheme of applying voltages to the flash memory device in accordance with anther embodiment of the invention, and FIG. 10 is a timing diagram illustrating points at which the voltages shown in FIG. 9 are applied. In FIGS. 9 and 10, there is shown a voltage biasing pattern for preventing the program-inhibited memory cell from being softly programmed in the case that the NAND string is comprised of two ground selection transistors, 201 and 203, and two string selection transistors 211 and 213.

The voltage biasing pattern shown in FIGS. 9 and 10 is similar to that shown in FIGS. 6 through 8, but includes the feature of applying voltages to first and second ground selection lines SSL1 and SSL2 connected each to the two string selection transistors 211 and 213. Generally, the ground voltage 0V is applied to the ground selection line GSL for program inhibition. Therefore, when the program voltage Vpgm is applied to the wordline most adjacent to the string selection line SSL (i.e., the 31'th wordline WL31), the string selection transistor SST, which is coupled to the string selection line SSL, is turned off and a channel voltage of the program-inhibited memory cell coupled to the 31'th wordline WL31 is boosted up. As a result, it would cause a program-inhibited memory cell to be softly programmed because there is generated a high electric field between the channels of the memory cells.

In order to overcome the soft-programming effect in the memory cell coupled to the wordline most adjacent to the string selection line SSL, there are provided the two string selection transistors 211 and 213 at least in the NAND string. Further, the blocking voltage Vblock is applied to the first string selection transistor 211 adjacent downward to the highest wordline WL31 of the NAND string, preventing a potential difference from being generated between the channel of the first string selection transistor 211 and the channel of the program-inhibited memory cell. And, the power source voltage Vcc is applied to the second string selection transistor 213 that is adjacent upward to the first string selection transistor 211, so that the second string selection transistor 213 is turned off.

Here, the first and second string selection transistors, 211 and 213, may be formed of floating-gate transistors as same as the memory cells, or single transistors without charge-storing layers. The charge-storing layer may be formed of a conductive floating gate that is made of one among a silicon nitride film, an insulation film with high dielectric constant, silicon dots, metal dots, and silicon-germanium (Si—Ge) dots.

Figure 2:
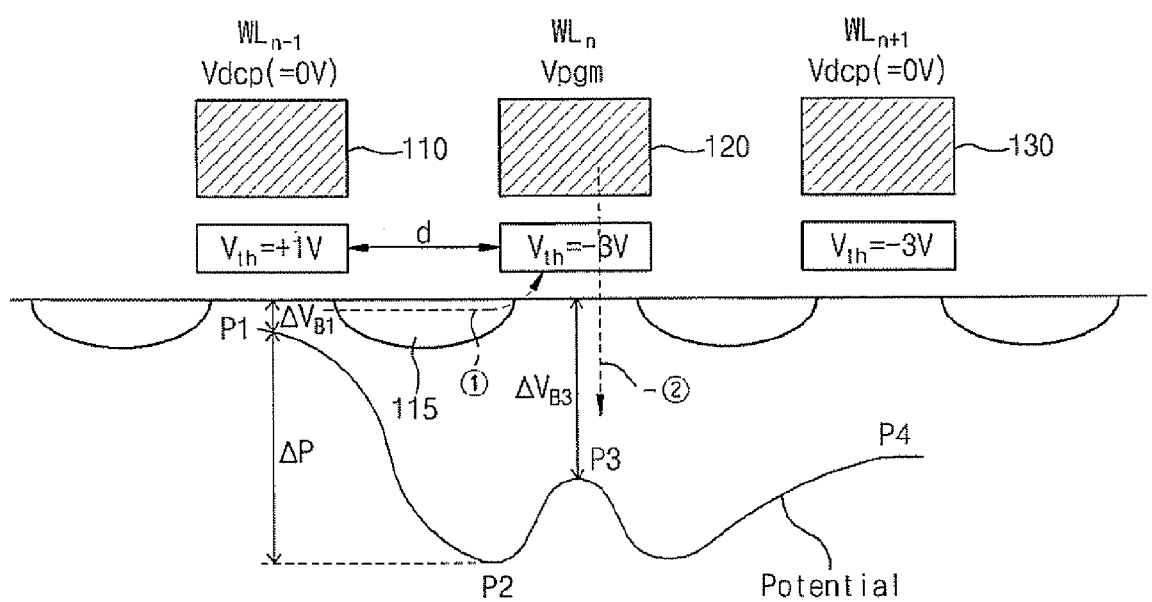
FIG. 2 is a schematic diagram illustrating a soft-programming effect that is generated within a program-inhibited memory cell as the flash memory device is increasing in integration density.
Figure 11:
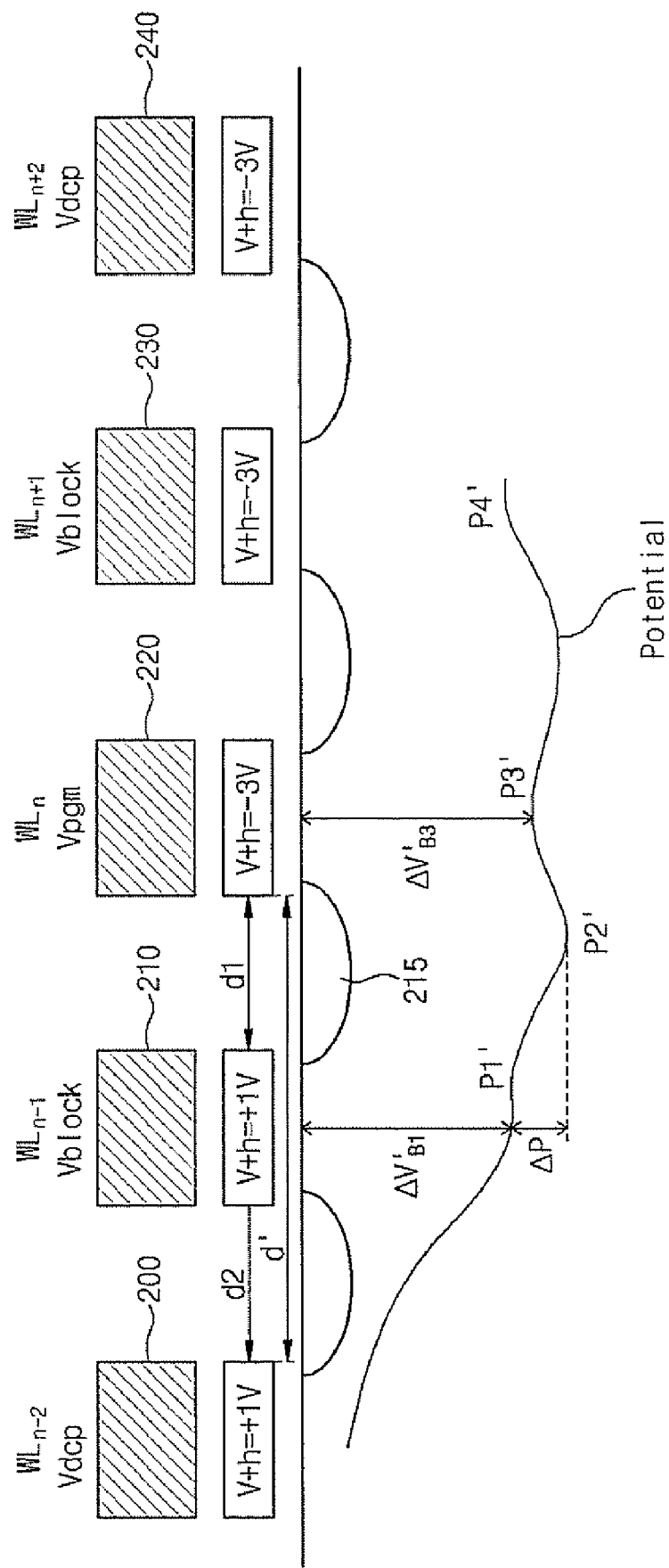
FIG. 11 is a schematic diagram of the configuration of potential patterns formed in channels of a program-inhibited memory cell and memory cells adjacent thereto in accordance with the programming scheme by the invention.

FIG. 11 is a schematic diagram the configuration of potential patterns formed in channels of a program-inhibited memory cell and memory cells adjacent thereto in accordance with the programming scheme by the invention. Referring to FIGS. 2 and 11, it can be seen that the potential difference ΔP between the memory cells 210 and 230 most adjacent to the program-inhibited memory cell 220, by the programming method of the invention, is reduced less than that shown in FIG. 2. As aforementioned with relevant to FIG. 2, a primary factor causing the soft-programming effect in the program-inhibited memory cell 120 is the potential difference ΔP, larger than a constant level, in the N-well region 115 connected to the memory cell 120 and the adjacent memory cell 110 when the program voltage Vpgm is being applied thereto. This arises from the fact that the distance d between the memory cells becomes smaller as the integration density of the flash memory increases. In general, the probability of injecting electrons into the floating gate of the program-inhibited memory cell 120 is raised in proportion to the value of (P1−P2)/d. Here, the parameter d means the distance between the program-inhibited memory cell 120 and the memory cell 110 that is most closely adjacent downward to the program-inhibited memory cell 120. The parameter P2 represents a value obtained by subtracting Vth (e.g., 0.7V) from the potential P3 formed in the channel of the program-inhibited memory cell 120. Thus, the probability of injecting electrons into the floating gate of the program-inhibited memory cell 120 increases as the distance d between the program-inhibited memory cell 120 and the adjacent memory cell 110 becomes smaller and the potential difference ΔP in the channels of the memory cells, 111 and 120, becomes larger.

Considering those relations with the parameters of the distance and potentials in the memory cells, the invention uses the blocking voltage Vblock that is applied to at least one or more wordlines, $WL_{n-1}$ and $WL_{n+1}$, adjacent to the selected wordline WLn during the programming operation, turning on the memory cells 210 and 230 most adjacent to the program-inhibited memory cell 220. As a result, it minimizes the potential difference ΔP in the channels of the memory cells, preventing the soft-programming effect. As the potential difference ΔP is minimized in the channels of the memory cells although distances d1 and d2 between the memory cells is narrower, it is able to protect the program disturbance such as the soft-programming effect. In this case, while physical intervals between the memory cells correspond to d1 and d2, it effects as same as the distance between the program-inhibited memory cell 220 and the adjacent memory cell extends to d'.

In addition, with an increase of the integration density for the flash memory device, a channel length in the memory cell becomes shortened and a drain voltage level thereof is also lowered to cause a punch-through effect. Accordingly, there would be induced a phenomenon of charge leakage while the channel of the program-inhibited memory cell is being boosted up. Therefore, in order to prevent the leakage of charges through therethrough, the programming method by the invention increases the memory cells to which the decoupling voltage Vdcp is applied. For instance, it increases the number of wordlines supplied with the decoupling voltage Vdcp, in plurality, at the up and downsides of a wordline to which the program voltage Vpgm is applied. As an example, FIG. 4 shows the feature that the decoupling voltage Vdcp is applied to the second lower-adjacent wordline $WL_{n-2}$, which is located downward from the selected wordline WLn, and the first upper-adjacent wordline $WL_{n+1}$, or to the second lower-adjacent wordline $WL_{n-2}$ and the second upper-adjacent wordline $WL_{n+2}$. But, in purpose of preventing the punch-through effect aforementioned, the decoupling voltage Vdcp may be applied to the second and third lower-adjacent wordlines $WL_{n-2}$ and $WL_{n-3}$, which are located downward of the selected wordline WLn, and the first and second upper-adjacent wordlines $WL_{n-1}$ and $W_{n+2}$, or to the second and third lower-adjacent wordlines, $WL_{n-2}$ and $WL_{n-3}$, and the second and third upper-adjacent wordlines $WL_{n+2}$ and $WL_{n+2}$.

As aforementioned, according to the programming method for the flash memory device by the invention, the blocking voltage is first applied to at least one or more wordlines adjacent to the selected wordline. The decoupling voltage is applied to at least one or more wordlines adjacent to a wordline with supply of the decoupling voltage, or to an adjacent wordline adjacent upward to the selected wordline. Then, the pass voltage is applied to the remaining wordlines deselected while the program voltage is applied to the selected wordline. The blocking voltage is set as being higher than the maximum threshold voltage of a programmed memory cell, but equal to or less than the pass voltage. The decoupling voltage is set as being higher than the maximum threshold voltage of an erased memory cell, but lower than the minimum threshold voltage of a programmed memory cell. With this scheme of applying voltages, there is no generation of potential difference between a channel of a program-inhibited cell coupled to the selected wordline and a channel of a memory cell adjacent to the program-inhibited cell. Thus, since there is no variation in a threshold voltage of the program-inhibited cell during a programming operation, it is able to prevent program disturbance such as a soft-programming effect. Furthermore, increasing the number of wordlines supplied with the decoupling voltage is helpful for preventing the punch-through effect therein.

Consequently, the present invention is advantageous for reliable programming operation and program inhibition even though intervals between memory cells become narrower and channel lengths become shorter along the increase of the integration density in the flash memory.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A non-volatile memory device, comprising:
    an array of flash memory cells;
    a voltage generator configured to generate a program voltage (Vpgm), a pass voltage (Vpass), a blocking voltage (Vblock) and a decoupling voltage (Vdcp)

during a flash memory programming operation, where $Vdcp<Vblock\leq Vpass<Vpgm$; and a row selection circuit electrically coupled to word lines in said array and to said voltage generator, said row selection circuit configured to route the program, blocking, decoupling and pass voltages from said voltage generator to first, second, third and fourth word lines in said array, respectively, where the second word line is spaced between the first and third word lines.

2. The memory device of claim 1, wherein the first and second word lines are immediately adjacent word lines; and wherein the second and third word lines are immediately adjacent word lines.

3. The memory device of claim 2, wherein the third and fourth word lines are immediately adjacent word lines.

4. The memory device of claim 2, wherein $Vdcp<Vblock<Vpass<Vpgm$.

5. The memory device of claim 1, wherein the blocking voltage is greater than a power supply voltage received by said voltage generator.

6. The memory device of claim 2, wherein said row selection circuit is further configured to route the blocking and decoupling voltages from said voltage generator to fifth and sixth immediately adjacent word lines in said array, respectively; and wherein the fifth and first word lines are immediately adjacent word lines.

7. The memory device of claim 2, wherein said array of flash memory cells comprises a plurality of NAND-type strings of memory cells having respective ground selection transistors therein; and wherein a word line electrically coupled to a plurality of the ground selection transistors receives the blocking voltage during the flash memory programming operation.

8. The memory device of claim 1, wherein the decoupling voltage (Vdcp) has a magnitude that is greater than a maximum threshold voltage of an erased memory cell in said array and less than a minimum threshold voltage of a programmed memory cell in said array.

9. A non-volatile memory device, comprising:
a NAND-type string of EEPROM cells;
a voltage generator configured to generate a program voltage (Vpgm), a pass voltage (Vpass), a blocking voltage (Vblock) and a decoupling voltage (Vdcp) during a flash memory programming operation, where $Vdcp\leq Vblock\leq Vpass<Vpgm$ and Vblock is greater than a power supply voltage received by said voltage generator; and a row selection circuit electrically coupled by word lines to said NAND-type string, said row selection circuit configured to route the program, blocking, decoupling and pass voltages from said voltage generator to first, second, third and fourth word lines in said NAND-type string, respectively, where the second word line is spaced between the first and third word lines.

10. The memory device of claim 9, wherein the first and second word lines are immediately adjacent word lines; wherein the second and third word lines are immediately adjacent word lines; and wherein the third and fourth word lines are immediately adjacent word lines.

11. The memory device of claim 10, wherein said row selection circuit is further configured to route the blocking and decoupling voltages from said voltage generator to fifth and sixth immediately adjacent word lines in said NAND-type string, respectively; and wherein the fifth and first word lines are immediately adjacent word lines.

12. The memory device of claim 9, wherein the decoupling voltage (Vdcp) has a magnitude that is greater than a maximum threshold voltage of an erased memory cell in said NAND-type string and less than a minimum threshold voltage of a programmed memory cell in said NAND-type sting.

13. A method of programming a flash memory array, comprising the steps of:
driving a selected wordline in the flash memory array with a program voltage (Vpgm) during a programming operation while simultaneously driving a first unselected wordline extending immediately adjacent the selected wordline with a blocking voltage (Vblock) and a second unselected wordline extending immediately adjacent the first unselected wordline with a decoupling voltage (Vdcp) and a third unselected wordline extending immediately adjacent the second unselected wordline with a pass voltage (Vpass), where $Vdcp<Vblock\leq Vpass<Vpgm$.

14. The method of claim 13, wherein $Vdcp<Vblock<Vpass<Vpgm$.

15. The method of claim 13, wherein the decoupling voltage (Vdcp) has a magnitude that is greater than a maximum threshold voltage of an erased memory cell in the flash memory array and less than a minimum threshold voltage of a programmed memory cell in the flash memory array.

* * * * *